United States Patent
Rankin et al.

(10) Patent No.: US 7,294,440 B2
(45) Date of Patent: Nov. 13, 2007

(54) METHOD TO SELECTIVELY CORRECT CRITICAL DIMENSION ERRORS IN THE SEMICONDUCTOR INDUSTRY

(75) Inventors: Jed H. Rankin, South Burlington, VT (US); Andrew J. Watts, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 10/710,602

(22) Filed: Jul. 23, 2004

(65) Prior Publication Data

US 2006/0019412 A1 Jan. 26, 2006

(51) Int. Cl.
- *G03C 5/00* (2006.01)
- *H01L 21/00* (2006.01)
- *H01L 21/66* (2006.01)
- *G01R 31/26* (2006.01)

(52) U.S. Cl. .............................. 430/30; 438/4; 438/14
(58) Field of Classification Search ................. 438/4, 438/14; 430/30
See application file for complete search history.

(56) References Cited

U.S. PATENT DOCUMENTS

| | | | |
|---|---|---|---|
| 5,468,595 A | 11/1995 | Livesay | |
| 5,963,783 A * | 10/1999 | Lowell et al. | 438/17 |
| 6,340,556 B1 * | 1/2002 | Wong | 430/296 |
| 6,605,951 B1 * | 8/2003 | Cowan | 324/754 |
| 6,630,288 B2 | 10/2003 | Shields et al. | |
| 6,653,231 B2 | 11/2003 | Okoroanyanwu et al. | |
| 6,937,914 B1 * | 8/2005 | Bode et al. | 700/121 |
| 2002/0160320 A1 | 10/2002 | Shields et al. | |
| 2002/0160628 A1 * | 10/2002 | Okoroanyanwu et al. | 438/795 |
| 2003/0139838 A1 * | 7/2003 | Marella | 700/110 |
| 2003/0219660 A1 * | 11/2003 | Ito et al. | 430/30 |

OTHER PUBLICATIONS

S. Wolf and R.N. Tauber, Silicon Processing for the VLSI Era, vol. 1, 2nd Edition, Lattice Press, 2000, pp. 489,626-627.*

S. Ghandhi, VLSI Fabrication Principles—Silicon and Gallium Arsenide, 2nd Edition, John Wiley & Sons, Inc., 1994, pp. 683-684, 719-721.*

(Continued)

*Primary Examiner*—Carl Whitehead, Jr.
*Assistant Examiner*—Heather Doty
(74) *Attorney, Agent, or Firm*—Schmeiser, Olsen & Watts; William D. Sabo

(57) ABSTRACT

A method to correct critical dimension errors during a semiconductor manufacturing process. The method includes providing a first semiconductor device. The first semiconductor device is analyzed to determine at least one critical dimension error within the first semiconductor device. A dose of electron beam exposure to correct the at least one critical dimension error during a subsequent process to form a second semiconductor device, or during modification of the first semiconductor device is determined. The subsequent process comprises providing a semiconductor structure. The semiconductor structure comprises a photoresist layer on a semiconductor substrate. A plurality of features are formed in the photoresist layer. At least one feature of the plurality of features comprises the at least one critical dimension error. The at least one feature comprising the critical dimension error is corrected by exposing the at least one feature to an electron beam comprising the dose of electron beam exposure, resulting in reduction of the size, or shrinkage, of the at least one feature comprising a critical dimension error.

30 Claims, 8 Drawing Sheets

OTHER PUBLICATIONS

Chung et al., Deep-Submicrometer Mos Device Fabrication Using a Photoresist-Ashing Technique, IEEE Electron Device Letters, vol. 9, No. 4, Apr. 1988, pp. 186-188.

Chiong et al., Contrast Enhancement of Resist Images by Surface Crosslinkage, IBM Technical Disclosure Bulletin, vol. 31, No. 3, Aug. 1988, p. 349.

\* cited by examiner

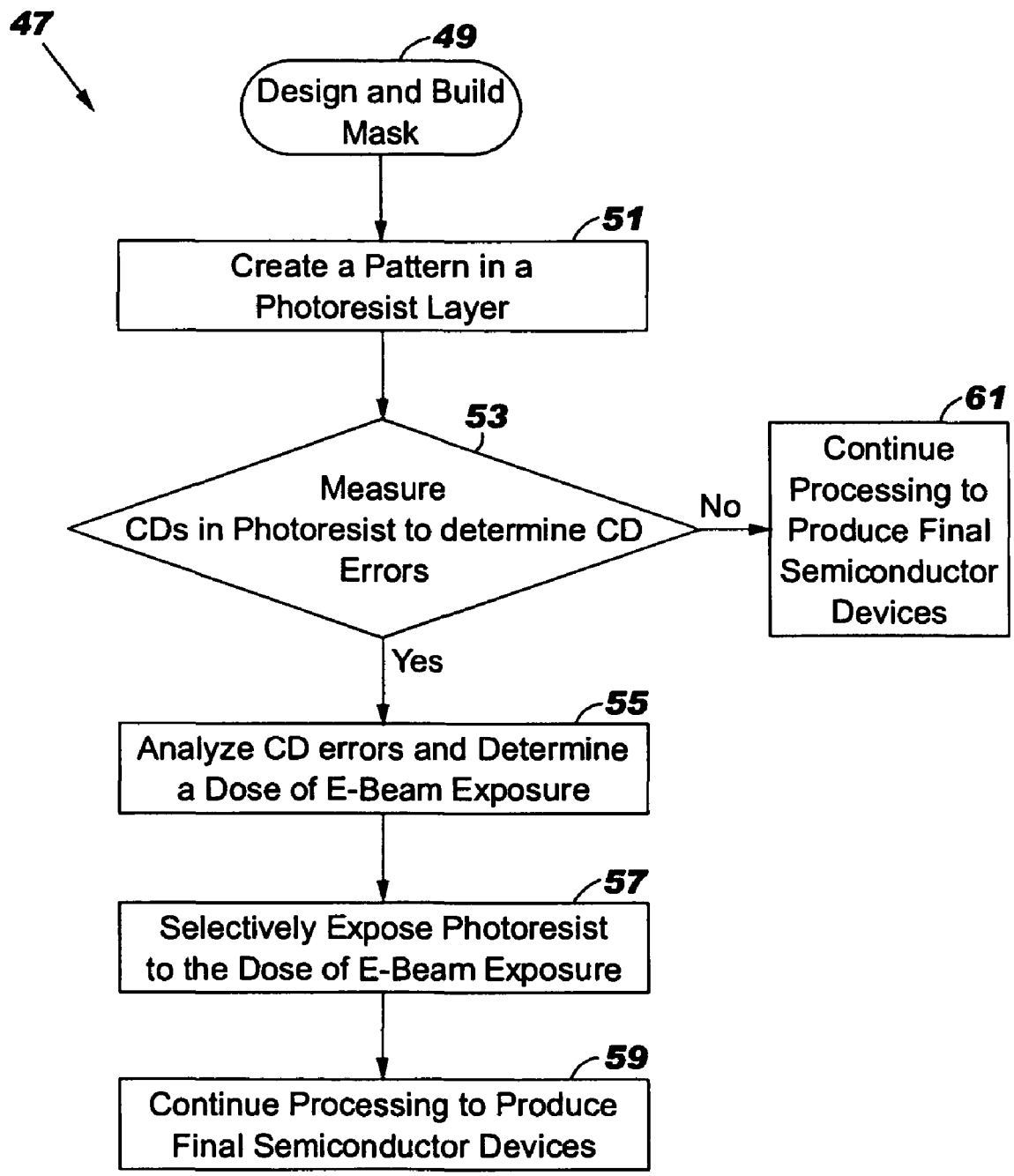

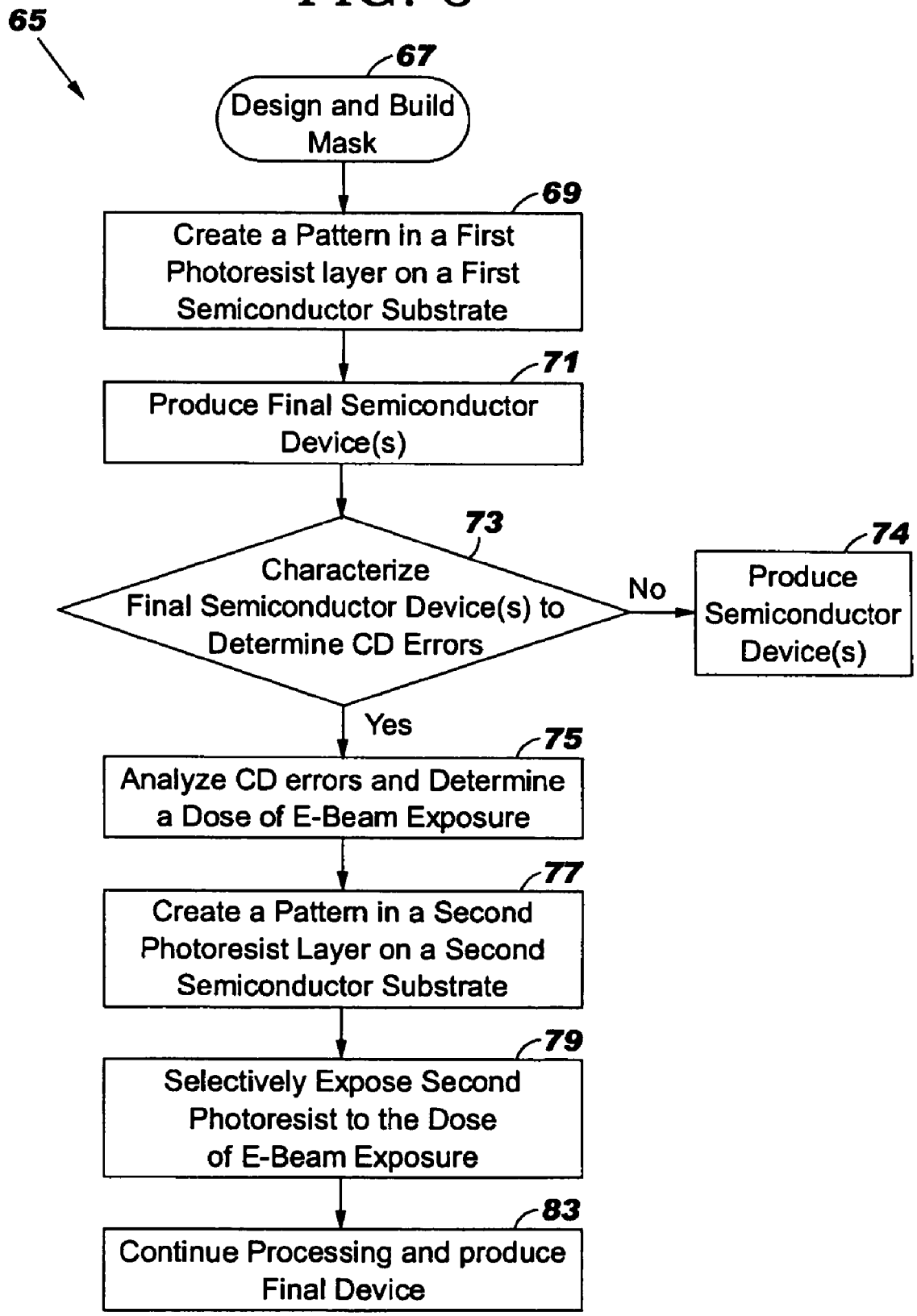

METHOD TO SELECTIVELY CORRECT CRITICAL DIMENSION ERRORS IN THE SEMICONDUCTOR INDUSTRY

BACKGROUND ART

BACKGROUND OF THE INVENTION

1. Technical Field

The present invention relates to a method for correcting critical dimension errors during a semiconductor device or semiconductor mask manufacturing process.

2. Related Art

During a manufacturing process, electrical components within an electrical circuit may not be produced within design specifications. Electrical components within an electrical circuit that are not fabricated to the design specifications may cause the electrical circuit to malfunction or operate incorrectly. Therefore there exists a need to produce electrical components during a manufacturing process that meet design specifications for both physical and electrical characteristics.

SUMMARY OF THE INVENTION

The present invention provides a method, comprising:
providing a first semiconductor device;
analyzing the first semiconductor device to determine at least one critical dimension error within the first semiconductor device;
determining from said at least one critical dimension error, a dose of electron beam exposure to correct the at least one critical dimension error during a subsequent process to form a second semiconductor device, said subsequent process comprising;
providing a semiconductor structure, wherein the semiconductor structure comprises a photoresist layer on a semiconductor substrate;
forming a plurality features in the photoresist layer, wherein at least one feature of the plurality of features comprises the at least one critical dimension error;
correcting the at least one critical dimension error by exposing the at least one feature comprising the critical dimension error to an electron beam comprising said determined dose of electron beam exposure.

The present invention provides a method, comprising:
providing a mask and a semiconductor structure, wherein the semiconductor structure comprises a photoresist layer on a semiconductor substrate;
measuring on the mask, a plurality of critical dimensions within a pattern on the mask to determine at least one critical dimension error within said pattern;
propagating radiation through the mask to expose the photoresist layer to form a plurality of features in the photoresist layer, wherein at least one feature of the plurality of features comprises the at least one critical dimension error from the pattern on the mask;
determining from said at least one critical dimension error from the pattern on the mask, a dose of electron beam exposure that will be used to correct the at least one critical dimension error for the at least one feature comprising the at least one critical dimension error; and
correcting the critical dimension error by exposing the at least one feature comprising the critical dimension error to an electron beam comprising said determined dose of electron beam exposure that corrects the critical dimension error of the at least one feature.

The present invention provides a method, comprising:
providing a semiconductor structure, wherein the semiconductor structure comprises a photoresist layer on a semiconductor substrate;
forming a plurality of features in the photoresist layer;
measuring a plurality of critical dimensions of the plurality of features to determine at least one critical dimension error for at least one feature of the plurality of features;
determining from said at least one critical dimension error, a dose of electron beam exposure to correct the at least one critical dimension error for the at least one feature of the plurality of features;
correcting the at least one critical dimension error by exposing the at least one feature comprising the critical dimension error to an electron beam comprising said determined dose of electron beam exposure that corrects the critical dimension error of the at least one feature.

The present invention provides a method, comprising:
providing a mask photoresist layer;
forming a plurality of features in the mask photoresist layer;
measuring a plurality of critical dimensions of the plurality of features in the mask photoresist layer to determine at least one critical dimension error for at least one feature of the plurality of features;
determining from said at least one critical dimension error, a dose of electron beam exposure that will be used to correct the at least one critical dimension error for the at least one feature comprising the at least one critical dimension error; and
correcting the critical dimension error by exposing the at least one feature comprising the critical dimension error to an electron beam comprising said determined dose of electron beam exposure that corrects the critical dimension error of the at least one feature.

The present invention advantageously provides a method to produce electrical components during a manufacturing process that are design specifications for both physical and electrical characteristics.

BRIEF DESCRIPTION OF THE DRAWINGS

FIG. 5 is a flowchart depicting an algorithm for a photoresist based method for correcting a critical dimension error, in accordance with embodiments of the present invention.

FIG. 6 is a flowchart depicting an algorithm for a final semiconductor device based method for correcting a critical dimension error, in accordance with embodiments of the present invention.

DISCLOSURE OF INVENTION

Figure 1:
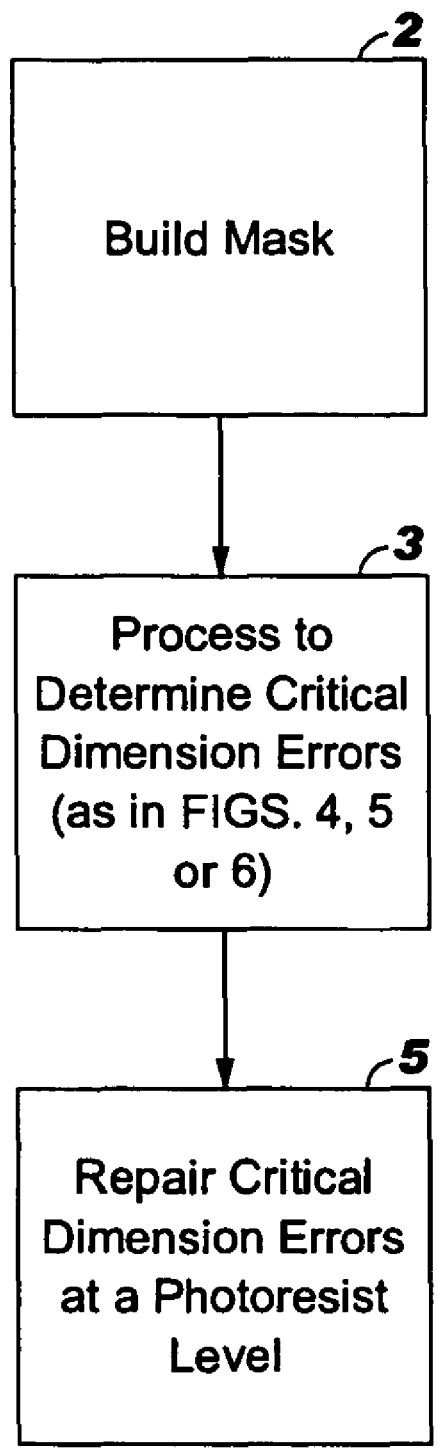
FIG. 1 illustrates a flowchart describing an algorithm for determining and correcting a critical dimension (CD) error(s) for a feature(s) produced on a semiconductor substrate, in accordance with embodiments of the present invention.

FIG. 1 illustrates a flowchart describing an algorithm for determining and correcting a critical dimension (CD) error(s) for a feature(s) within a photoresist layer, wherein said feature(s) is to be subsequently transferred to a semiconductor substrate during a photolithography process, in accordance with embodiments of the present invention. Thus, a feature(s) will ultimately define a corresponding structure within the semiconductor substrate. The term "critical dimension error" (CD error) is defined herein as an incorrect dimension for the feature(s). The CD error may be caused during a photolithography process by, inter alia, an incorrect pattern or image within a mask, an error during a pattern transfer from the mask to the photoresist, an incorrect original design, etc. The CD error(s) is corrected during a semiconductor device manufacturing process at a photoresist level without building a new mask. Although the following description is described with reference to photolithography using radiation (e.g., laser 6A and 6B) and a mask, note that any lithography method known to a person of ordinary skill in the art may be used including, inter alia, a maskless lithography method, a direct write lithography method, etc. During a photolithography process (i.e., using radiation), a photomask (see mask 9 in FIG. 2A) is used to produce a plurality of features (e.g., feature 15B in FIG. 2B) within a semiconductor wafer (see semiconductor wafer 19 in FIG. 2B). Radiation is provided through the mask to project a patterned image on a photoresist layer that will define the plurality of features within the photoresist layer that remains after a subsequent process (e.g., chemical etch) that removes soluble portions of the photoresist layer. In turn, the plurality of features in the photoresist layer are utilized to define a plurality of structures, inter alia, doping regions, deposition regions, etching regions, isolation regions, transistor gates, and other device structures and elements (e.g., electrical components) within the semiconductor substrate. Additionally, the plurality of features in the photoresist layer may also define conductive lines or conductive pads associated with metal layers within the semiconductor substrate. During the above described process, the CD error(s) for the feature(s) within the layer of photoresist material on the semiconductor substrate may be caused by, inter alia, an incorrect pattern or image on a mask, an error during a pattern transfer from the mask to the photoresist, lens aberration during the image projection, an incorrect original design, etc. The CD error is corrected at a photoresist layer level as described below by FIG. 1.

In step 2 of FIG. 1, a mask comprising a specific design for producing features to be transferred to a layer of photoresist material on a semiconductor substrate is built or provided. In step 3 CD error(s) are determined. Methods for determining the CD error(s) are described with reference to FIGS. 4, 5, and 6. In step 5, the CD error(s) is corrected at a photoresist level. A system for correcting the CD error(s) is described with reference to FIGS. 2A, 2B, 3A, and 3B.

Figure 2A:
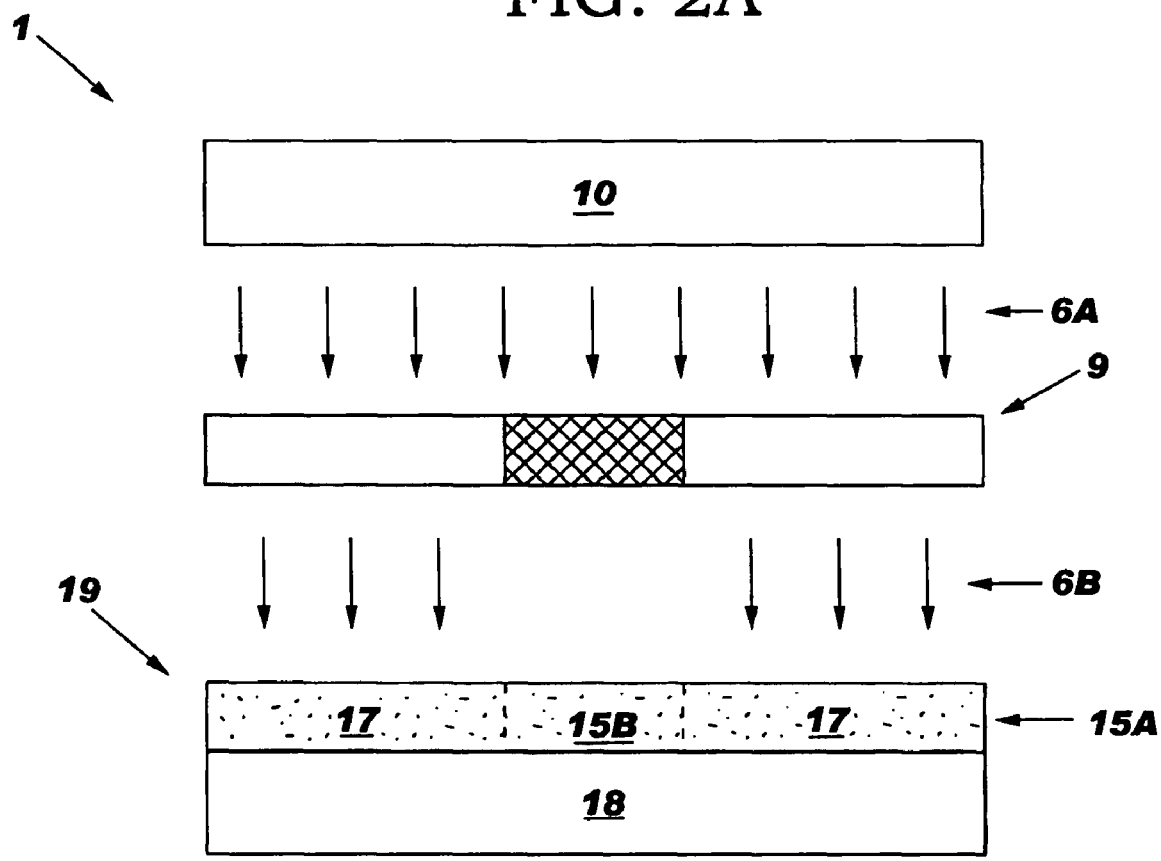
FIG. 2A illustrates a system comprising a device for emitting radiation through a photomask onto a photoresist layer, in accordance with embodiments of the present invention.

FIG. 2A illustrates a system 1 comprising a device 10 for emitting radiation 6A and 6B through a photomask 9 on to a photoresist layer 15A disposed on a substrate 18, in accordance with embodiments of the present invention. The photoresist layer 18 is assumed to use a positive photoresist but may alternatively comprise a negative photoresist if the inverse pattern is used in the mask 9 of FIGS. 2A and 2B. A semiconductor wafer 19 comprises the photoresist layer 15A and the substrate 18. The substrate 18 may comprise a semiconductor substrate. The substrate 18 may comprise a semiconductor substrate and an insulating layer. The device 10 may be any radiation emitting device known to a person of ordinary skill in the art that emits radiation at a wavelength such that the radiation photochemically reacts with the resist material of the photoresist layer 9. The radiation 6A propagating through the photomask 9 is selectively transmitted (i.e., becoming radiation 6B) to a specified area 17 on the photoresist layer 15A as defined by the patterned image on the photomask 9. The specified area 17 on the photoresist layer 15A that the radiation 6B makes contact with will undergo a photochemical change such that specified area 17 on the photoresist layer 15A becomes soluble or insoluble if a negative photoresist is used.

Figure 2B:
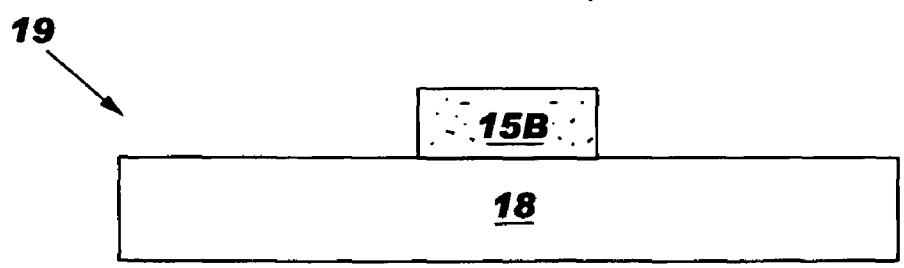
FIG. 2B illustrates the photoresist layer of FIG. 2A that has undergone a photochemical change has become insoluble due to the diverted radiation of FIG. 2A in accordance with embodiments of the present invention.

FIG. 2B illustrates that the specified area 17 on the photoresist layer 15A from FIG. 2A has undergone a photochemical change and has been removed such as by chemical developing, in accordance with embodiments of the present invention. Thus, all that remains of the photoresist layer 15A from FIG. 1 is a feature 15B in FIG. 2B. The feature 15B will be utilized to define a structure, inter alia, doping regions, deposition regions, etching regions, isolation regions, transistor gates, other device structures and elements (e.g., electrical components), conductive lines or conductive pads associated with metal layers, etc within the semiconductor wafer 19. The feature 15B is determined to comprise a critical a dimension error (determining CD errors is described with reference to FIGS. 4, 5, and 6). A method to correct the CD error (at the photoresist level) is described with reference to FIGS. 3A and 3B.

Figure 3A:
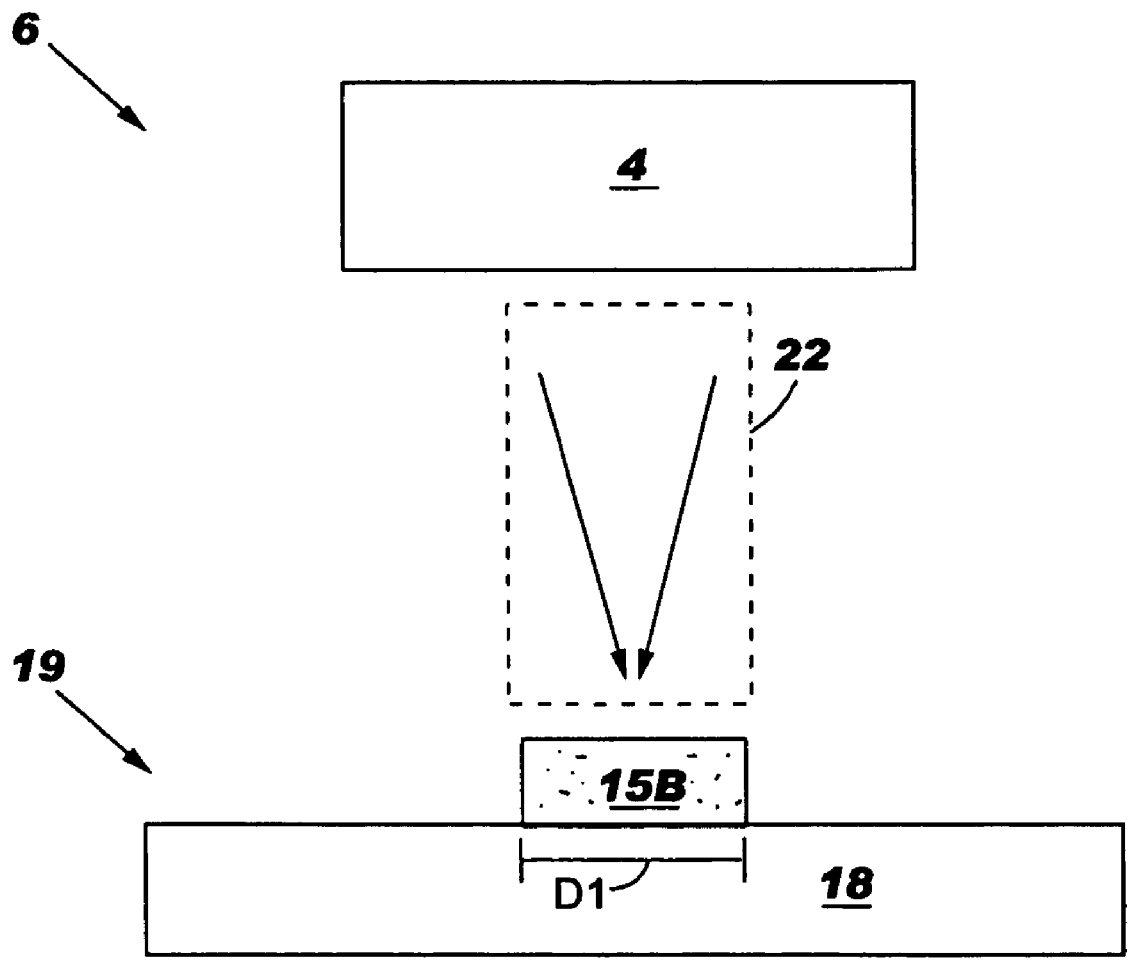
FIG. 3A illustrates a system comprising a device for emitting an electron beam onto a feature to correct a critical dimension error, in accordance with embodiments of the present invention.
Figure 7:
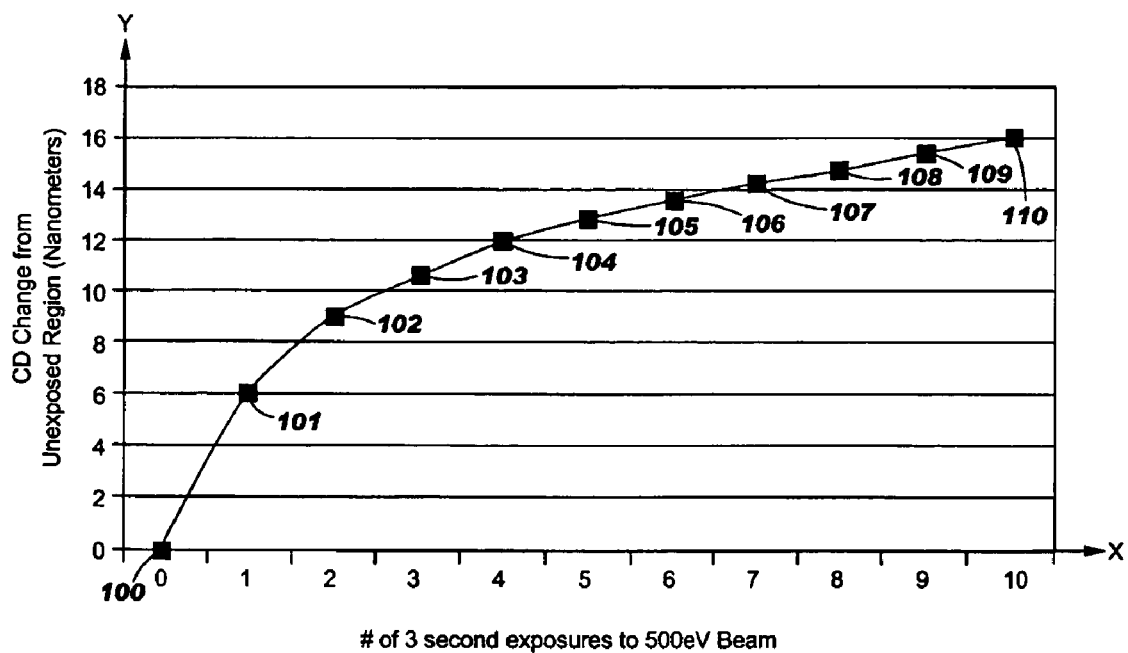
FIG. 7 illustrates a graph for providing a relationship between a plurality critical dimension size changes for a feature(s) and a plurality electron beam exposures to the feature, in accordance with embodiments of the present invention.

FIG. 3A illustrates a system 6 comprising a device 4 for emitting an electron beam onto the feature 15B to correct a CD error, in accordance with embodiments of the present invention. The device 4 may be, inter alia, a scanning electron microscope (SEM), an electron beam direct write lithography tool, or large spot electron beam emitter, etc. The electron beam 22 is a low energy electron beam (e.g., electron beam in a range of about 250 electron volts (eV) to about 10000 eV). The electron beam 22 is emitted in a specified dose dependent upon a size of the CD error (i.e., how much correction is needed). The feature may be exposed to multiple emissions of the electron beam 22, each emission of the electron beam being at a specific power level for a specific amount of time (i.e., eV/unit of time). The dose of electron beam exposure is dependent upon a size of the CD error, and the physical properties of the feature with the CD error. For example, FIG. 7 illustrates (as described supra) a graph showing 3 second exposures to a 500 eV electron beam, 10 times. The feature 15B comprises a dimension D1 (e.g., length) that has been determined to be an incorrect dimension (i.e., a CD error). In response to the CD error, the electron beam 22 is directed on the feature 15B to reduce (i.e., shrink) the dimension D1 of the feature 15B to a smaller dimension D2 to become feature 15C in FIG. 3B. The dimension D1 of the feature 15B is reduced to the smaller dimension D2 of a feature 15C due to a chemical breakdown, and out gassing of the photoresist material and any entrapped solvent that occurs when the electron beam 22 makes contact with the feature 15B. The difference between the dimension D1 and the dimension D2 accounts for the CD error and therefore the feature 15C comprising the dimension D2 does not comprise the CD error.

Figure 3B:
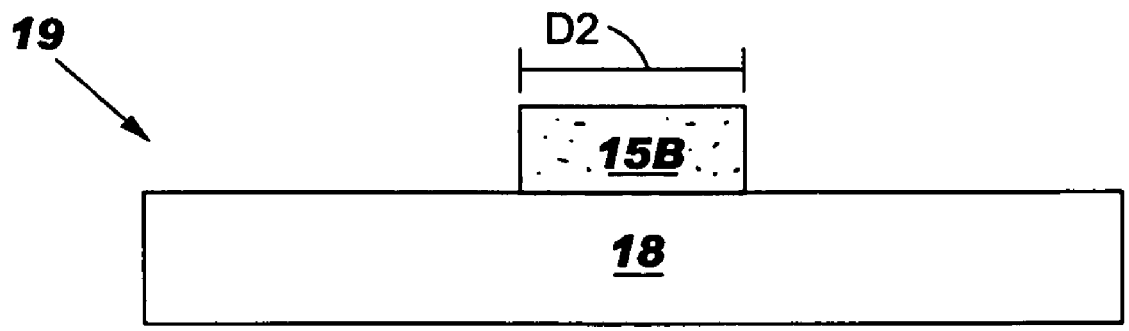
FIG. 3B illustrates a reduced dimension of a feature from FIG. 3A, in accordance with embodiments of the present invention

FIG. 3B illustrates the reduced dimension D2 of a feature 15C, in accordance with embodiments of the present invention. The dimension D2 of a feature 15C has been reduced from the D1 of the feature 15B in FIG. 3A as described with reference to FIG. 3A.

Figure 4A:
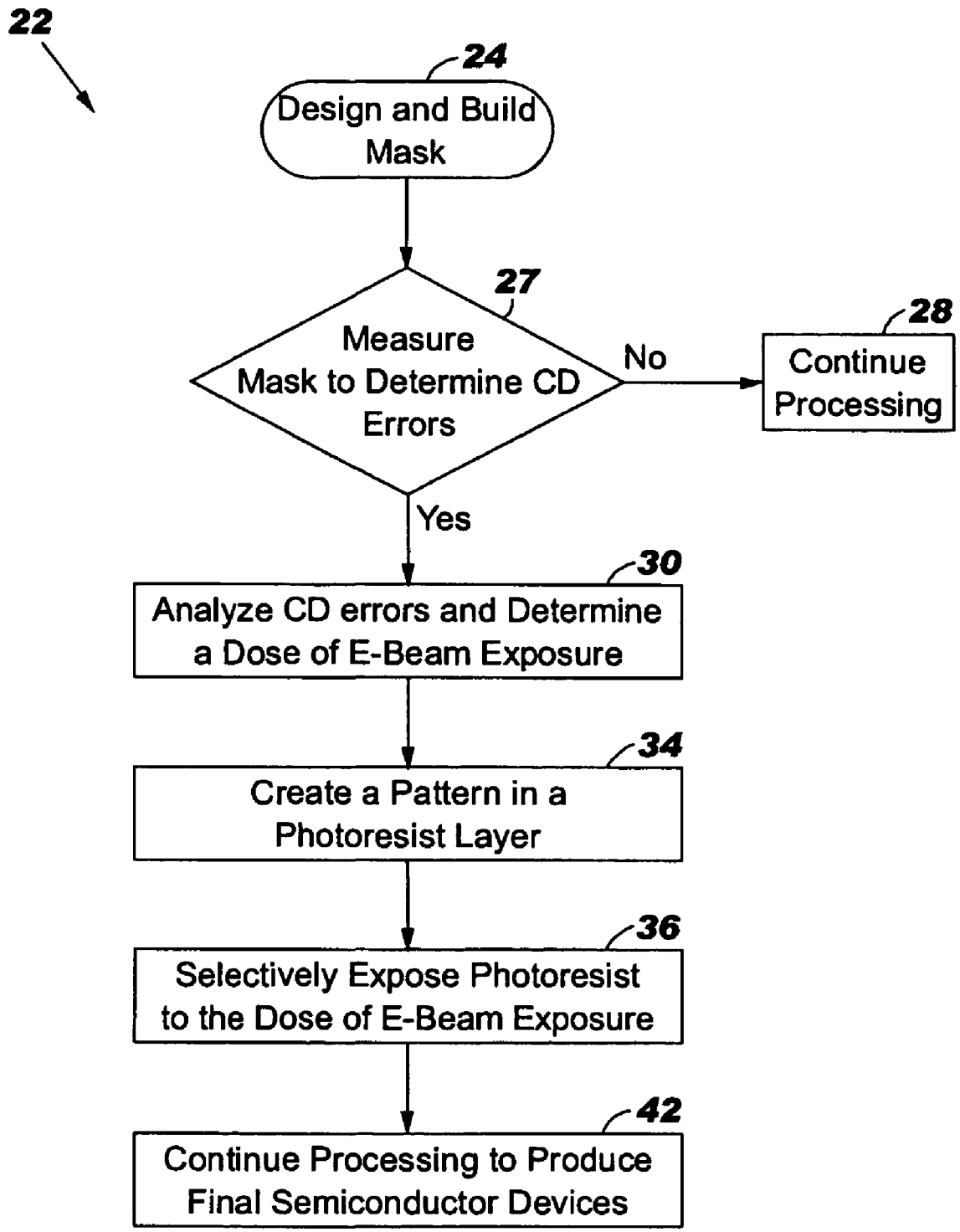
FIG. 4A is a flowchart depicting an algorithm for a first photomask based method for correcting a critical dimension error, in accordance with embodiments of the present invention.

FIG. 4A is a flowchart depicting an algorithm 22 for a first photomask based method for correcting a CD error at a photoresist level, in accordance with embodiments of the present invention. The algorithm 22 is described with reference to FIGS, 2A, 2B, 2C, and 2D. In step 24, a photomask (e.g., photomask 9 in FIG. 2A) is designed and built for a photolithography process to produce a semiconductor device(s). In step 27, a pattern or image on the photomask is measured to determine if there are any CD errors that will produce a CD error in a feature (e.g., feature 15B in FIG. 2B) during the photolithography process. Measuring techniques may include, inter alia, using a SEM, etc. If there is not an error(s) found in the photomask in step 27, then in step 28 the photomask may be used to produce a semiconductor device(s). If there is a CD error found in the photomask in step 27, then in step 30 the CD error is analyzed to determine a dose of electron beam exposure that may be used to correct the CD error in a subsequent step. A method for determining the dose of electron beam exposure is described with reference to FIG. 7 as described, infra. In step 34, radiation (e.g., radiation 6A and 6B in FIG. 2A) is propagated through the photomask comprising the CD error thereby resulting in a feature(s) (e.g., feature 15B in FIG. 2B) comprising the CD error. In step 36, the feature(s) is exposed to the dose of electron beam exposure, thereby shrinking the feature size, and ultimately correcting the CD error (e.g., feature 15C in FIG. 3B). In step 42 a semiconductor device manufacturing process is completed thereby producing a semiconductor device(s) (e.g., a semiconductor chip) without a CD error(s).

Figure 4B:
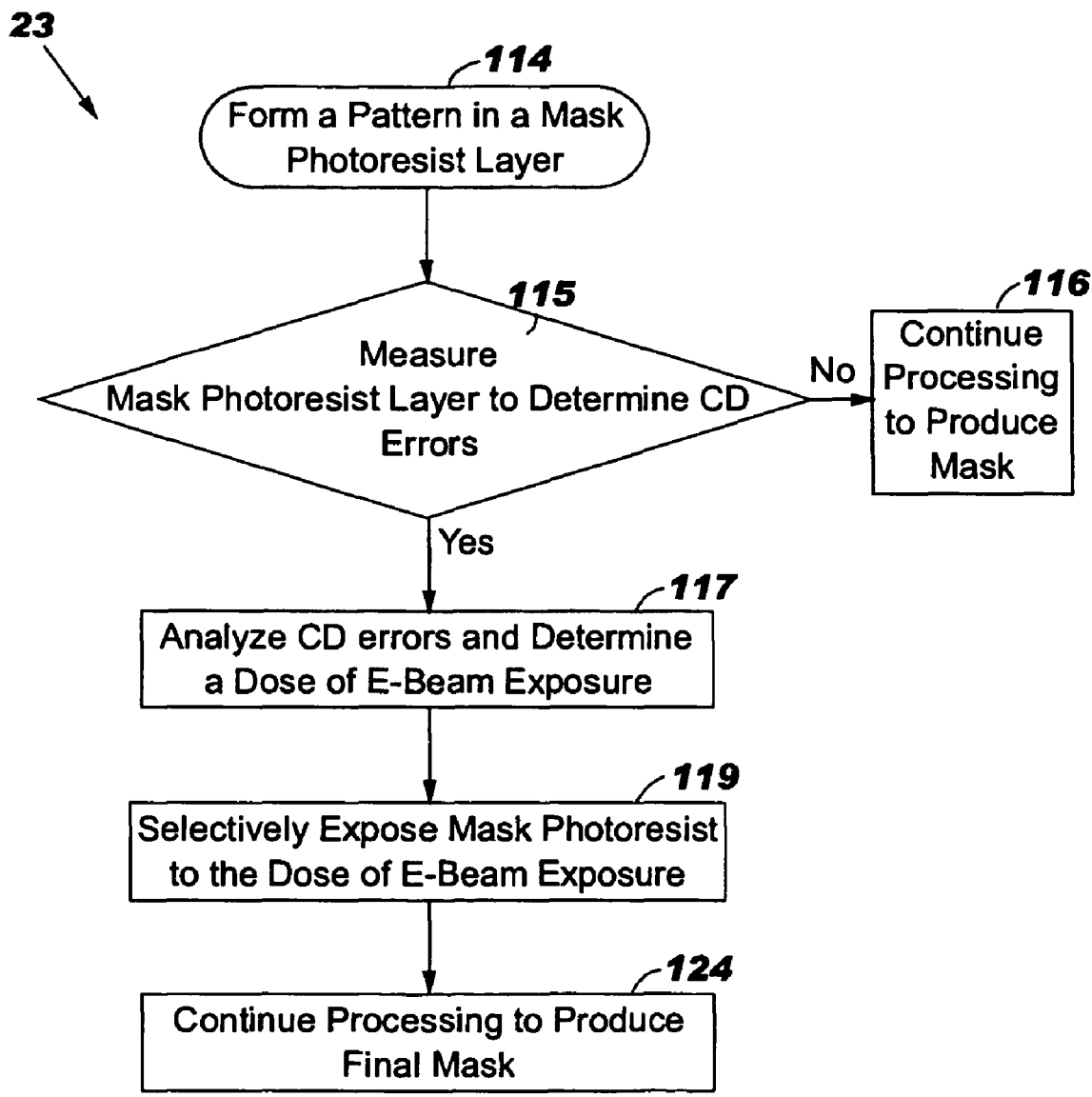
FIG. 4B is a flowchart depicting an algorithm for a second photomask based method for correcting a critical dimension error, in accordance with embodiments of the present invention.

FIG. 4B is a flowchart depicting an algorithm 23 for a second photomask based method for correcting a CD error at a mask 9 photoresist level, in accordance with embodiments of the present invention. The algorithm 23 occurs during step 2 of FIG. 1 as a photomask is built. In step 114, a pattern (i.e., a feature) is formed in the photomask photoresist layer (e.g., photomask 9 in FIG. 2A). In step 115, a pattern or image formed the photomask is measured to determine if there are any CD errors in the photomask photoresist layer that will produce a CD error in a feature (e.g., feature 15B in FIG. 2B) during a photolithography process. Measuring techniques may include, inter alia, using a SEM, etc. If there is not an error(s) found in the photomask photoresist layer in step 115, then in step 116 the processing is continued to produce a final photomask. The final photomask may be used to produce a semiconductor device(s). If there is a CD error found in the photomask photoresist layer in step 115, then in step 117 the CD error is analyzed to determine a dose of electron beam exposure that may be used to correct the CD error (i.e., in the photomask photoresist layer) in a subsequent step. A method for determining the dose of electron beam exposure is described with reference to FIG. 7 as described, infra. In step 119, the photomask photoresist layer is selectively exposed to the dose of electron beam exposure, thereby shrinking a feature(s) size in the photomask photoresist layer, and ultimately correcting the CD error. In step 124, processing is continued to produce a final photomask without a CD error(s).

FIG. 5 is a flowchart depicting an algorithm 47 for a photoresist based method for correcting a CD error at a photoresist level, in accordance with embodiments of the present invention. The algorithm 47 is described with reference to FIGS. 2A, 2B, 2C, and 2D. In step 49, a photomask (e.g., photomask 9 in FIG. 2A) is designed and built for a photolithography process to produce a semiconductor device(s). In step 51, radiation (e.g., 6A and 6B in FIG. 2A) is propagated through the photomask to produce a feature(s) (e.g., feature 15B in FIG. 2B). In step 53, the feature(s) is measured and to determine if the feature(s) comprises a CD error. Measuring techniques may include, inter alia, using an SEM, etc. If a CD error is not found in the feature in step 53, then in step 61 a semiconductor device manufacturing process may continue to produce a semiconductor device(s). If it is determined in step 53 that due to an error (e.g.,an incorrect pattern or image on a mask, an error during a pattern transfer from the mask to the photoresist, an incorrect original design, etc ) the feature(s) comprises a CD error then in step 55, the CD error is analyzed to determine a dose of electron beam exposure that may be used to correct the CD error in a subsequent step. A method for determining the dose of electron beam exposure is described with reference to FIG. 7 as described, infra.

In step 57, the feature(s) is exposed to the dose of electron beam exposure, thereby shrinking the feature size, and ultimately correcting the CD error (e.g., feature 15C in FIG. 3B). In step 59, a semiconductor device manufacturing process is completed thereby producing a semiconductor device(s) (e.g., a semiconductor chip) without a CD error(s).

FIG. 6 is a flowchart depicting an algorithm 65 for a final semiconductor device (e.g., a semiconductor chip) based method for correcting a CD error at a photoresist level, in accordance with embodiments of the present invention. The algorithm 65 is described with reference to FIGS, 2A, 2B, 2C, and 2D. In contrast to the algorithms 22 and 47 of FIGS. 4 and 5, the process of algorithm =of FIG. 6 comprises building a first semiconductor device(s) with a CD error(s) and using the first semiconductor device(s) to correct the CD error(s) during a process to build subsequent semiconductor devices.

In step 67, a photomask (e.g., photomask 9 in FIG. 2A) is designed and built for a photolithography process to produce a semiconductor device(s). In step 69, the photomask of step 67 is used during the photolithography process to produce a first semiconductor device(s). In step 73, first semiconductor device(s) is characterized to determine a CD error(s). Characterizing the first semiconductor device(s) may comprise performing a functionality test of the first semiconductor device to determine an actual operating speed for the first semiconductor device (e.g., a signal speed between or within various circuits within the semiconductor device, a signal speed within an individual component (transistor, resistor, capacitor, etc)). Alternatively, the characterization may include determination of other physical dimensions, such as current, resistance, or capacitance. Based on a comparison of the actual operating conditions of the first semiconductor device and either a calculated or designed operating characteristic of the first semiconductor device or an actual operating charicteristic of a second semiconductor device known to comprise no CD errors, it may be determined that specific circuits are not operating correctly due to specific electrical components (e.g., transistor, capacitor, resistor) or a combination therein that comprise(s) a CD error(s). If a CD error is not found in step 73, then in step 74 a semiconductor device manufacturing process may continue to produce a semiconductor device(s). If in step 75, a CD error(s) is found, or it is determined that a deliberate CD error may enhance the functionality of the semiconductor device, the CD error(s) is analyzed to determine a dose of electron beam exposure that may be used to correct the CD error in during a photolithography process to build a second semiconductor device(s) using the photomask of step 67. A method for determining the dose of electron beam exposure is described with reference to FIG. 7 as described, infra. In step 77, radiation (e.g., radiation 6A and 6B in FIG. 2A) is propagated through the photomask comprising the CD error thereby producing a feature(s) (e.g., feature 15B in FIG. 2B) comprising the CD error. In step 79, the feature(s) is exposed to the dose of electron beam exposure, thereby shrinking the feature size, and ultimately correcting the CD error (e.g., feature 15C in FIG. 3B).

In step 83 a semiconductor device manufacturing process is completed thereby producing a semiconductor device(s) (e.g., a semiconductor chip) without a CD error(s).

FIG. 7 is a graph comprising test data for providing a relationship between a plurality CD size (i.e., dimension) change for a feature(s) and a plurality of electron beam exposures to the feature so that a specific dose of electron beam exposure may be selected based on an amount CD size change required to correct the CD error for a feature(s), in accordance with embodiments of the present invention. The photoresist material used in FIG. 7 is AR237J manufactured by Shipley. Note that any photoresist material may be used thereby producing a different characteristic response to e-beam exposure. The feature comprises a line formed in photoresist. The Y-axis represents a CD size (i.e., dimension) change in nanometers. The X-axis represents a plurality (i.e., 10) exposures of 3 seconds each to a 500 eV electron beam. The values for CD size (i.e., dimension) changes with respect to a number exposures of 3 seconds each to a 500 eV electron beam are represented by data points 100-110. As illustrated by the data points 100-110, it may be determined that as the number of electron beam exposures increase, so does the amount of size change for the critical dimension(s). Therefore, using the graph of FIG. 7, a dose of electron beam exposure may be determined for a specific CD error. For example, if a 12 nanometer CD size change is required to correct a CD error, then by viewing data point 104 on the graph of FIG. 7 it may be determined that 12 seconds of exposure (i.e., 4 exposures*3 seconds per exposure) to the 500 eV electron beam (i.e., the dose of electron beam exposure) will correct the CD error (12 nanometers). Thus, three exposures of 4 seconds each, would alternatively cause a 12 nanometer CD size change.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method, comprising:
providing a first semiconductor device;
analyzing the first semiconductor device to determine a first critical dimension error for a first feature of a first plurality of features within the first semiconductor device;
determining from said first critical dimension error, a dose of electron beam exposure to correct the first critical dimension error during a subsequent process to form a second semiconductor device, said subsequent process comprising;
providing said second semiconductor device, wherein the second semiconductor device comprises a photo resist layer on a semiconductor substrate;
forming a second plurality of features in the photo resist layer, wherein a second feature of the second plurality of features comprises the first critical dimension error;
correcting the first critical dimension error for the second feature by selectively exposing only the second feature comprising the first critical dimension error to an electron beam comprising said determined dose of electron beam exposure.

2. The method of claim 1, wherein the dose of electron beam exposure comprises a power level for the electron beam for a specified amount of time.

3. The method of claim 1, wherein said correcting the first critical dimension error comprises decreasing a size of the second feature.

4. The method of claim 1, wherein said determining the dose of electron beam exposure comprises:
providing a graphical relationship between a changing of critical dimension size changes and dosage of electron beam exposure; and
choosing the dose of electron beam exposure for a desired size change in critical dimension size, said choosing being based on said graphical relationship.

5. The method of claim 1, wherein said analyzing comprises measuring a plurality of critical dimensions within the first semiconductor device to determine the first critical dimension error.

6. The method of claim 1, wherein said analyzing comprises performing a functionality test of the first semiconductor device to determine a plurality of operating conditions for a plurality of electrical components within the first semiconductor device.

7. The method of claim 6, wherein said analyzing further comprises comparing said plurality of operating conditions to a plurality of calculated operating conditions of the first semiconductor device.

8. The method of claim 6, wherein said analyzing further comprises comparing said plurality of operating conditions to a plurality of actual operating characteristics of a second semiconductor device known to comprise no CD errors.

9. The method of claim 1, further comprising forming an electrical component in a space in the second semiconductor device that is defined by the second feature.

10. The method of claim 9, wherein the electrical component is selected from the group consisting of a transistor, a resistor, a wire, a diode, and a capacitor.

11. The method of claim 1, wherein said determined dose of electron beam exposure comprises multiple emissions of an electron beam for a specified amount of time.

12. A method, comprising:
providing a mask and a semiconductor structure, wherein the semiconductor structure comprises a photo resist layer on a semiconductor substrate;
measuring on the mask, a plurality of critical dimensions within a pattern on the mask to determine a first critical dimension error for a first critical dimension within said pattern;
propagating radiation through the mask to expose the photo resist layer to form a plurality of features in the photo resist layer, wherein a first feature of the plurality of features comprises the first critical dimension error from the pattern on the mask;

determining from said first critical dimension error from the pattern on the mask, a dose of electron beam exposure that will be used to correct the first critical dimension error for the first feature; and correcting the first critical dimension error by selectively exposing only the first feature comprising the first critical dimension error to an electron beam comprising said determined dose of electron beam exposure that corrects the first critical dimension error of the first feature.

13. The method of claim 12, wherein the dose of electron beam exposure comprises a power level of the electron beam for a specified amount of time.

14. The method of claim 12, wherein said correcting the first critical dimension error comprises decreasing a size of the first feature.

15. The method of claim 12, wherein said determining the dose of electron beam exposure comprises:

providing a graphical relationship between a changing of critical dimension size changes and dosage of electron beam exposure; and choosing the dose of electron beam exposure for a desired size change in critical dimension size, said choosing being based on said graphical relationship.

16. The method of claim 12, further comprising forming an electrical component in a space in a semiconductor device that is defined by the first feature.

17. The method of claim 16, wherein the electrical component is selected from the group consisting of a transistor, a resistor, a wire, a diode, and a capacitor.

18. The method of claim 12, wherein said determined dose of electron beam exposure comprises multiple emissions of an electron beam for a specified amount of time.

19. A method, comprising:

providing a semiconductor structure, wherein the semiconductor structure comprises a photo resist layer on a semiconductor substrate;

forming a plurality of features in the photo resist layer;

measuring a plurality of critical dimensions of the plurality of features to determine a first critical dimension error for a first feature of the plurality of features;

determining from said first critical dimension error, a dose of electron beam exposure to correct the first critical dimension error for the first feature of the plurality of features;

correcting the first critical dimension error by selectively exposing only the first feature comprising the first critical dimension error to an electron beam comprising said determined dose of electron beam exposure that corrects the first critical dimension error of the first feature.

20. The method of claim 19, wherein the dose of electron beam exposure comprises a power level of the electron beam for a specified amount of time.

21. The method of claim 19, wherein said correcting the first critical dimension error comprises decreasing a size of the first feature.

22. The method of claim 19, wherein said determining the dose of electron beam exposure comprises:

providing a graphical relationship between a changing of critical dimension size changes and dosage of electron beam exposure; and choosing the dose of electron beam exposure for a desired size change in critical dimension size, said choosing being based on said graphical relationship.

23. The method of claim 19, further comprising forming an electrical component in a space in a semiconductor device that is defined by the first feature.

24. The method of claim 23, wherein the electrical component is selected from the group consisting of a transistor, a resistor, a wire, a diode, and a capacitor.

25. The method of claim 19, wherein said determined dose of electron beam exposure comprises multiple emissions of an electron beam for a specified amount of time.

26. A method, comprising:

providing a mask photo resist layer;

forming a plurality of features in the mask photo resist layer;

measuring a plurality of critical dimensions of the plurality of features in the mask photo resist layer to determine a first critical dimension error for a first feature of the plurality of features;

determining from said first critical dimension error, a dose of electron beam exposure that will be used to correct the first critical dimension error for the first feature comprising the first critical dimension error; and correcting the first critical dimension error by selectively exposing only the first feature comprising the first critical dimension error to an electron beam comprising said determined dose of electron beam exposure that corrects the first critical dimension error of the first feature.

27. The method of claim 26, wherein the dose of electron beam exposure comprises a power level of the electron beam for a specified amount of time.

28. The method of claim 26, wherein said correcting the first critical dimension error comprises decreasing a size of the first feature.

29. The method of claim 26, wherein said determining the dose of electron beam exposure comprises:

providing a graphical relationship between a changing of critical dimension size changes and dosage of electron beam exposure; and choosing the dose of electron beam exposure for a desired size change in critical dimension size, said choosing being based on said graphical relationship.

30. The method of claim 26, wherein said determined dose of electron beam exposure comprises multiple emissions of an electron beam for a specified amount of time.

* * * * *